(12) United States Patent
Kinouchi et al.

(10) Patent No.: US 6,731,001 B2
(45) Date of Patent: May 4, 2004

(54) SEMICONDUCTOR DEVICE INCLUDING BONDED WIRE BASED TO ELECTRONIC PART AND METHOD FOR MANUFACTURING THE SAME (75) Inventors: Kan Kinouchi, Okazaki (JP); Mitsuhiro Saitou, Obu (JP); Takashi Nagasaka, Anjo (JP); Yuji Ootani, Okazaki (JP); Hiroyuki Yamakawa, Okazaki (JP); Koji Takeuchi, Nukata-gun (JP); Hirokazu Imai, Anjo (JP); Yukihiro Maeda, Kasugai (JP); Atsushi Kanamori, Nukata-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/918,803

(22) Filed: Aug. 1, 2001

(65) Prior Publication Data

US 2002/0020910 A1 Feb. 21, 2002

(30) Foreign Application Priority Data

| | | | |
|---|---|---|---|
| Aug. 10, 2000 | (JP) | ........................................ | 2000-243278 |
| Aug. 10, 2000 | (JP) | ........................................ | 2000-243279 |
| Aug. 10, 2000 | (JP) | ........................................ | 2000-243280 |
| Aug. 10, 2000 | (JP) | ........................................ | 2000-243281 |

(51) Int. Cl.[7] .............................................. H01L 23/52
(52) U.S. Cl. ........................ 257/734; 257/712; 257/687; 257/787
(58) Field of Search ................................ 287/712, 684, 287/734, 687, 787; 361/704, 725

(56) References Cited

U.S. PATENT DOCUMENTS

| | | | | |
|---|---|---|---|---|
| 5,450,283 A | * | 9/1995 | Lin et al. ..................... | 361/704 |
| 5,917,246 A |   | 6/1999 | Kasuya et al. | |
| 6,185,101 B1 |   | 2/2001 | Itabashi et al. | |
| 6,225,681 B1 | * | 5/2001 | Chungpaiboonpatana et al. ........................... | 257/642 |
| 6,278,182 B1 | * | 8/2001 | Liu et al. ..................... | 257/712 |

FOREIGN PATENT DOCUMENTS

| | | |
|---|---|---|
| EP | 0 926 939 A2 * | 6/1999 |
| JP | A-48-43159 | 6/1973 |
| JP | 58-27940 | 8/1981 |
| JP | U-58-195482 | 12/1983 |
| JP | A-62-252155 | 11/1987 |
| JP | H01-160844 | 11/1989 |
| JP | A-4-302457 | 10/1992 |
| JP | A-4-326554 | 11/1992 |
| JP | A-6-13540 | 1/1994 |
| JP | A-11-26691 | 1/1999 |
| JP | A-11-87567 | 3/1999 |
| JP | A-11-204967 | 7/1999 |
| JP | A-11-266090 | 9/1999 |
| JP | A-2000-252657 | 9/2000 |
| JP | A-2000-252658 | 9/2000 |
| JP | A-2001-94251 | 4/2001 |
| JP | H06-163745 | 6/2003 |
| WO | WO 95/27308 | 3/1995 |

OTHER PUBLICATIONS

Wolf et al., Silicon Processing for the VLSI Era, 2000, vol. 1, Lattice Press, 851–854).*
U.S. patent application Ser. No. 09/685,766, Kokudai et al., filed Oct. 11, 2000.
U.S. patent application Ser. No. 09/846,363, Fukatsu et al., filed May 2, 2001.

* cited by examiner

*Primary Examiner*—Nathan J. Flynn
*Assistant Examiner*—Leonardo Andujar
(74) *Attorney, Agent, or Firm*—Posz & Bethards, PLC (57) ABSTRACT

Several electronic parts are mounted on several ceramic substrates in a semiconductor device, and are wire bonded to the respective ceramic substrates through bonding wires. The electronic parts and the bonding wires are covered with an enclosing member on every ceramic substrate, and an inside of the enclosing member is filled with silicone gel for sealing. The ceramic substrates are bonded to a radiation fin together, and are mounted on a motherboard perpendicularly to the motherboard.

31 Claims, 10 Drawing Sheets

SEMICONDUCTOR DEVICE INCLUDING BONDED WIRE BASED TO ELECTRONIC PART AND METHOD FOR MANUFACTURING THE SAME

CROSS REFERENCE TO RELATED APPLICATIONS

This application is based upon and claims the benefit of Japanese Patent Applications No. 2000-243278 filed on Aug. 10, 2000, No. 2000-243279 filed on Aug. 10, 2000, No. 2000-243280 filed on Aug. 10, 2000, and No. 2000-243281 filed on Aug. 10, 2000, the contents of which are incorporated herein by reference.

BACKGROUND OF THE INVENTION

1. Field of the Invention

This invention relates to a semiconductor device having an electronic part that is mounted on and electrically connected to a substrate through a bonding wire and sealed together with the bonding wire.

2. Description of the Related Art

Figure 1:
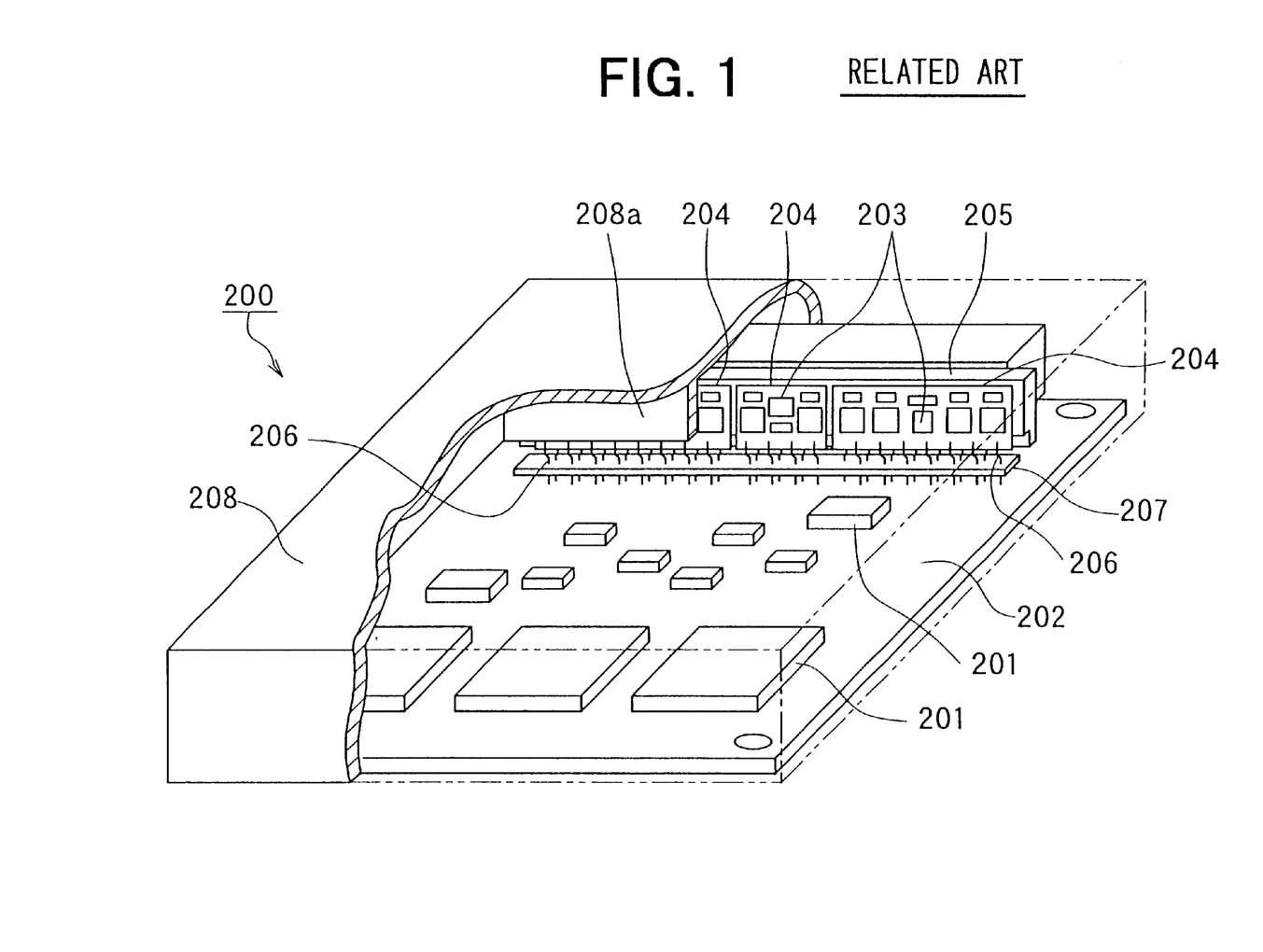
FIG. 1 is a perspective view showing a semiconductor device according to a related art.
Figure 2:
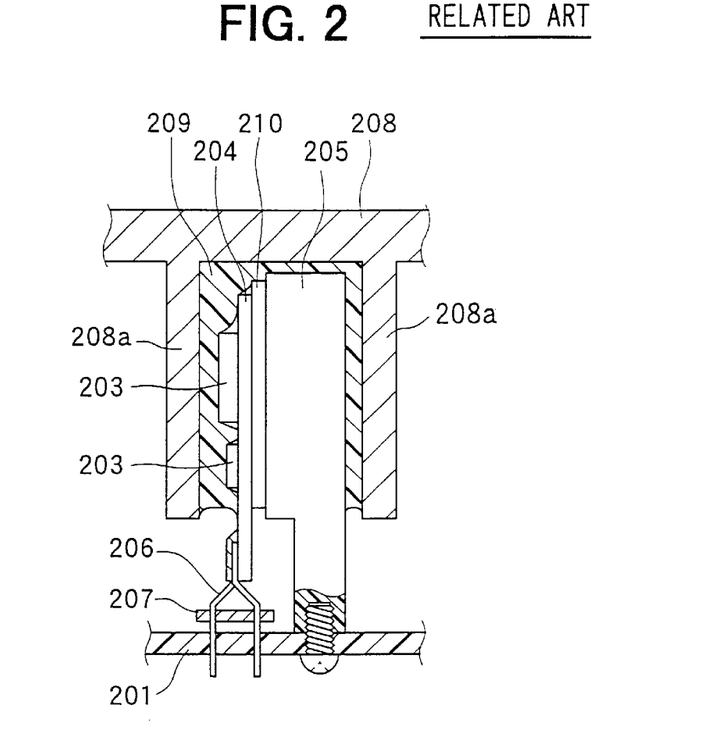
FIG. 2 is across-sectional view showing a main constitution of the semiconductor device shown in FIG. 1.

FIGS. 1 and 2 show a semiconductor device 200. In the semiconductor device 200, referring to FIG. 1, several ceramic substrates 204 are disposed approximately perpendicularly to a motherboard 202 on which various electronic parts 201 are mounted. Referring to FIG. 2, electronic parts 203 are mounted on a surface of each ceramic substrate 204, and the other surface thereof is bonded to a radiation member 205 by silicone system conditioner 210. An end of a connection terminal (clip terminal) 206 is bonded to an edge portion of each ceramic substrate 204 at a side of the motherboard 202. The connection terminal 206 is positioned via an array board 207, and the other end of the connection terminal 206 is electrically connected to the motherboard 201.

These parts 201 to 207 are housed in a case 208. The electronic parts 203 mounted on the ceramic substrates 204, are surrounded by a protruding portion 208a of the case 208 to be protected from external environment and to improve radiation properties thereof, and are sealed with resin 209 or the like.

In the semiconductor device 200 having the above-described structure, as shown in FIGS. 1 and 2, in order to improve the efficiency in manufacturing steps, the several ceramic substrates 204 are disposed on the identical surface of the support member (radiation member) 205, and all the electronic parts 203 are sealed with the resin 209 together. In general, silicone rubber or the like having high viscosity is used as the resin 209 because it is easy to handle.

However, in a case where the electronic parts 203 are electrically connected to the ceramic substrates 204 by fine bonding wires, there is a possibility that the bonding wires are broken or strained when the resin is poured. The strained wires may be broken due to the resin 209 that strains when the semiconductor device 200 undergoes thermal shock cycles. Especially, when each diameter of the wires is smaller than 150 μm, this problem becomes prominent. In view of this point, silicone gel having low viscosity is preferred to seal the electronic parts 203.

However, when all the electronic parts 203 are sealed by silicone gel together, the following problems arise. First, because gal having low viscosity is disposed in a large volume (area), the gel may oscillate to break the bonding wires when the semiconductor device 200 oscillates.

Further, when gel is injected, bubbles are liable to be produced in the injected gel at step portions or the like between the ceramic substrates 204 and the radiation member 205. If bubbles exist around the fine bonding wires, the bubbles strain the gel during the thermal shock cycles of the semiconductor device 200, and as a result, the strained gel can strain the bonding wires.

SUMMARY OF THE INVENTION

The present invention has been made in view of the above problems. An object of the present invention is to provide a semiconductor device capable of restricting strain and breakage of a bonding wire wire-bonded to an electronic part sealed therein.

According to a first aspect of the present invention, a plurality of substrates are attached to a support member, and an electronic part is mounted on one of the substrates and electrically connected to the one through a bonding wire. An enclosing member covers the electronic part and the bonding wire, and a sealing material fills the enclosing member for sealing the electronic part and the bonding wire. Preferably, the enclosing member is composed of a plurality of enclosing members each of which is attached to a corresponding one of the plurality of substrates.

Because the electronic part and the bonding wire is covered with the enclosing member on every substrate, a volume of the sealing material filling the enclosing member is reduced, resulting in reduced amplitude of the sealing material. Further, bubbles are less liable to be produced in the sealing material. As a result, the bonding wire is restrained from being strained or broken by bubbles and the like.

According to a second aspect of the present invention, an electronic part is mounted on a substrate, and is electrically connected to the substrate through a bonding wire. An enclosing member covers the electronic part and the bonding wire, and a sealing material fills the enclosing member for sealing the electronic part and the bonding wire. The enclosing member has a first opening portion for injecting the sealing material into the enclosing member and a second opening portion for releasing gas from the enclosing member when the sealing material is injected. Preferably, the second opening portion has a width equal to or larger than that of the first opening portion. In this case, because gas can be released from the sealing material easily, bubbles produced in the sealing material can be reduced.

According to a third aspect of the present invention, an electronic part is disposed on a substrate, and a sealing member covering and sealing an electronic part and a bonding wire has a height equal to or smaller than 5 mm in a normal direction of the substrate, a shape that is contained in a rectangle having a long side of 60 mm and a short side of 20 mm, and a penetration in a range of 40 to 170 mm/10 (Refer to Japanese Industrial Standard (JIS), K 2220). The height of the sealing member is preferably equal to or smaller than 3 mm, and more preferably equal to or smaller than 2.5 mm. As a result, the oscillation of the sealing member can be suppressed, thereby preventing strain and breakage of the bonding wire.

According to a fourth aspect of the present invention, a method for manufacturing a semiconductor device comprises disposing an electronic part on a substrate; soldering a solder connecting member to the substrate; washing the substrate in a first solvent for removing flux from the substrate while keeping a concentration of the flux in the first solvent being 0.4 wt % or less, the flux being used when the solder connecting member is soldered; washing the substrate in a second solvent for removing the first solvent from the substrate, while keeping a concentration of the first solvent dissolved in the second solvent being 0.8 wt % or less; and electrically connecting the electronic part to the substrate by wire bonding using a bonding wire. In this method, because washing residues can be removed effectively, the connecting property of the bonding wire can be improved.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENT

Figure 3:
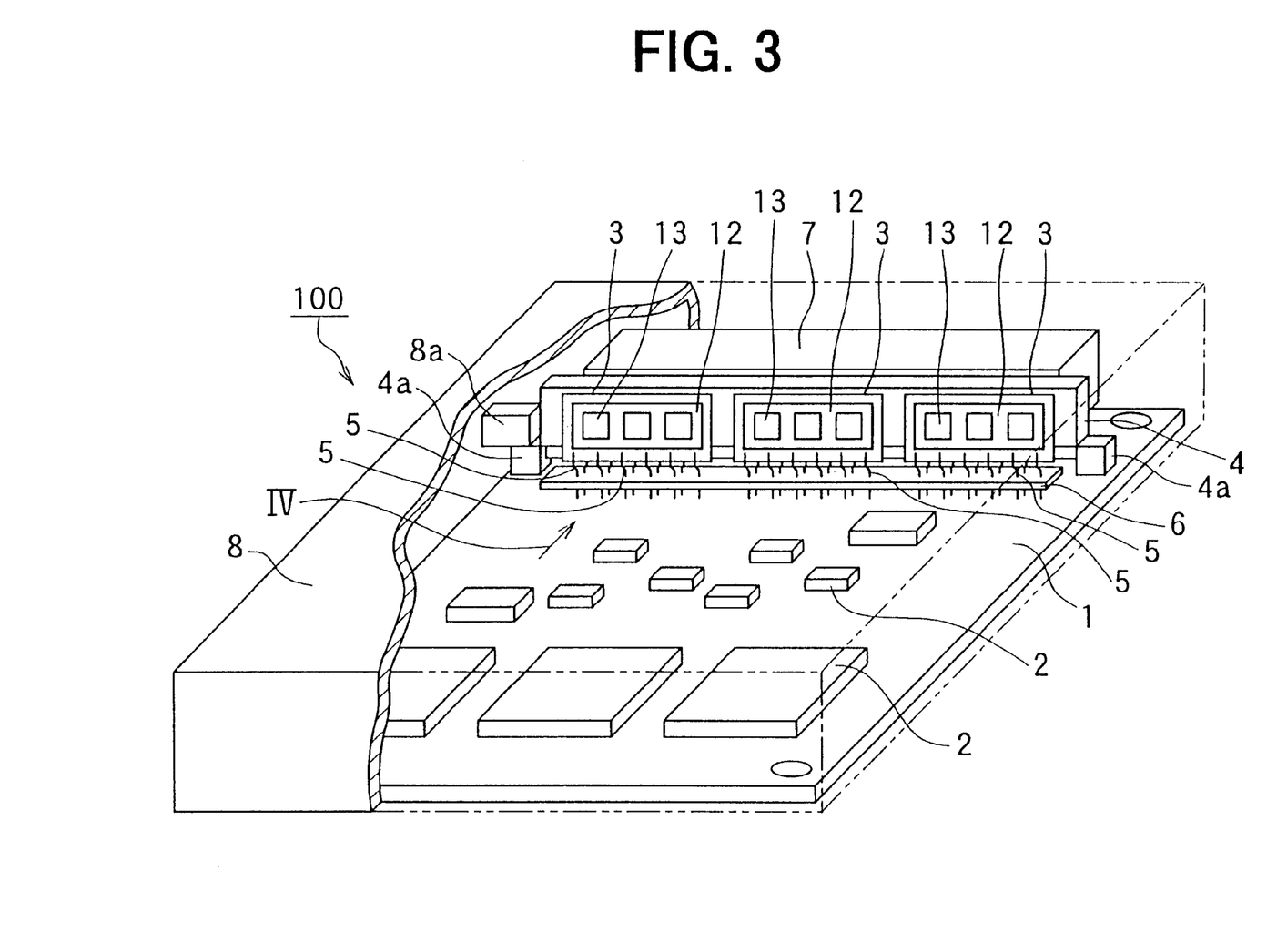
FIG. 3 is a perspective view showing a semiconductor device according to a preferred embodiment of the present invention.

FIG. 3 shows an entire structure of a semiconductor device 100 according to a preferred embodiment of the present invention. It should be noted FIG. 3 omits a cover 17 (shown in FIG. 5) covering rectangular ceramic substrates 3. In the present embodiment, the semiconductor device 100 is a hybrid IC.

As shown in FIG. 3, various electronic parts 2 are mounted on a motherboard (printed board) 1 as a second substrate. On the motherboard 1, several ceramic substrates 3 as first substrates are mounted in a state where the ceramic substrates 3 are attached to a radiation fin 4 as a radiation member (support member). The radiation fin 4 is made of, for example, aluminum (Al).

The ceramic substrates 3 are electrically connected to the motherboard 1 through connection terminals (clip terminals) 5 as solder connecting members. The connection terminals 5 are positioned by an array board 6. A connector 7 is disposed at a side of the radiation fin 4 opposite the side where the ceramic substrates 3 are mounted. Although it is not shown in the figures, lead terminals of the connector 7 are electrically connected to the motherboard 1 by soldering.

The motherboard 1 and the parts 2 to 7 mounted on the motherboard 1 are covered with a case 8. The case 8 has protruding portions 8a in the vicinity of the radiation fin 4. The radiation fin 4 has protruding portions 4a at ends thereof in a direction in which the ceramic substrates 3 are arranged. The protruding portions 8a of the case 8 respectively abut the protruding portions 4a of the radiation fin 4. Accordingly, heat generated from electronic parts mounted on the ceramic substrates 3 is transmitted to the case 8 through the radiation fin 4, thereby performing radiation.

Figure 4:
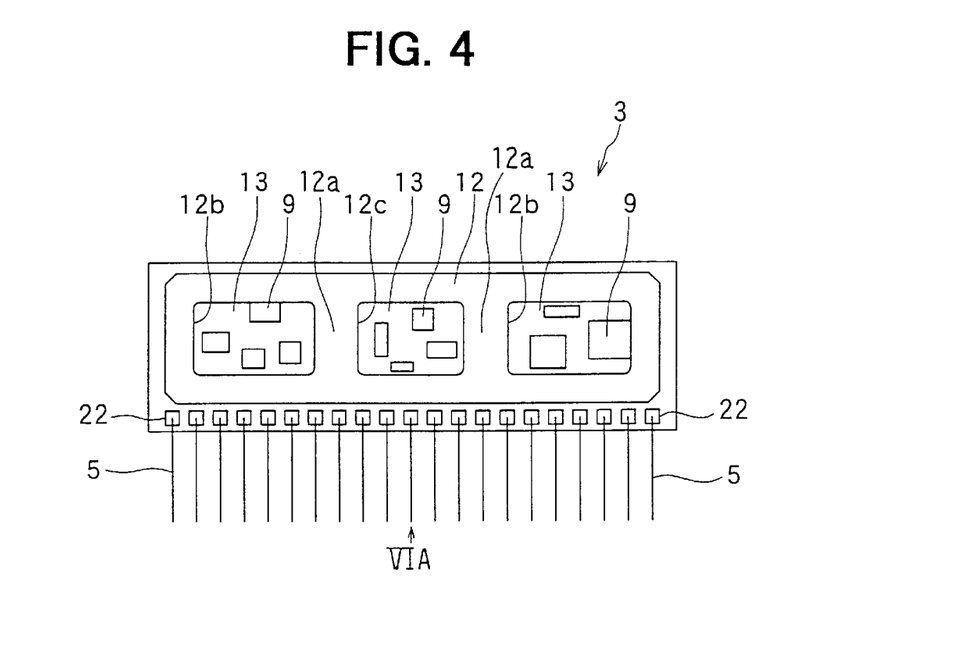
FIG. 4 is a schematic view showing one of ceramic substrates of the semiconductor device.
Figure 5:
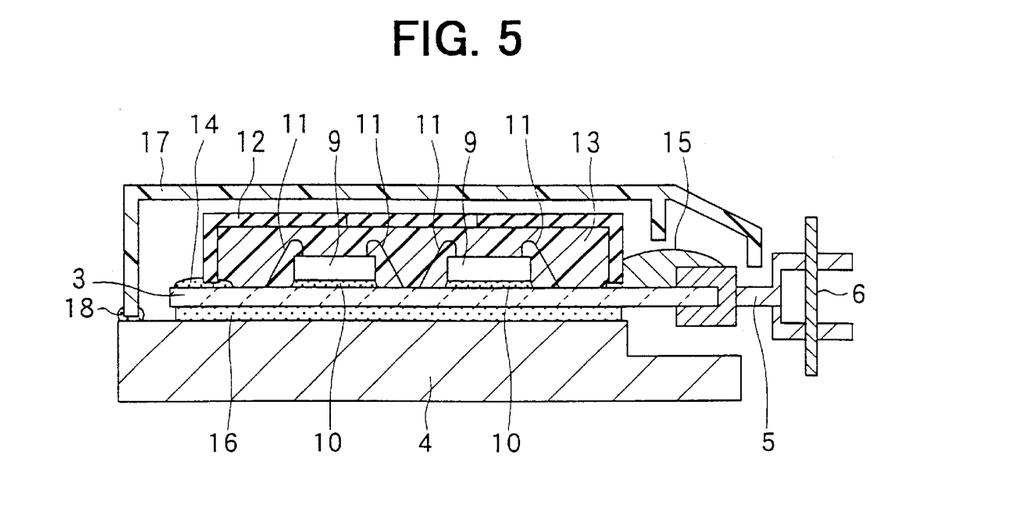
FIG. 5 is a cross-sectional view showing the ceramic substrate in a thickness direction thereof.

Next, the structure in the vicinity of the radiation fin 4 and the ceramic substrates 3 is explained below. In the figures, three ceramic substrates 3 are bonded to one radiation fin 4. FIG. 4 shows one of the ceramic substrates 3 in a direction indicated by arrow IV in FIG. 3, and FIG. 5 is a cross-sectional view showing the ceramic substrate 3 in the thickness direction thereof. In FIG. 5, the motherboard 1, the connector 7, and the case 8 are omitted. As shown in FIGS. 4 and 5, several electronic parts 9 such as semiconductor chips are mounted on each ceramic substrate 3. Each ceramic substrate 3 is constructed to have one electrical function.

Lands (not shown) for mounting the electronic parts and lands (not shown) for wire bonding are formed on the ceramic substrate 3. These lands are formed from, for example, a silver (Ag) thick film. To the lands for mounting the electronic parts, the electronic parts are bonded through conductive adhesive 10. The conductive adhesive 10 is made of, for example, epoxy resin containing Ag filler therein. The electronic parts 9 further have lands thereon (not shown) which are electrically connected to the lands for wire bonding on the ceramic substrate 3 through bonding wires 11. The bonding wires 11 are fine wires, each diameter of which is less than 150 μm. In this embodiment, the bonding wires 11 are made of gold (Au).

An enclosing member 12 is disposed on each ceramic substrate 3, and surrounds a region where the electronic parts 9 and the bonding wires 11 are disposed. The enclosing member 12 is adhered to the ceramic substrate 3 by silicone system adhesive 14, at an inner side of the periphery of the ceramic substrate 3. The region of the ceramic substrate 3 surrounded by the enclosing member 12 is filled with silicone gel (sealing material) 13, and accordingly, is sealed. The enclosing member 12 keeps the shape of the silicone gel 13, and is made of silicone rubber in this embodiment.

Opening portions 12b, 12c are formed on the upper surface of the enclosing member 12 that is approximately parallel to the rectangular ceramic substrate 3, so that an inside and an outside of the enclosing member 12 communicate with each other. The silicone gel 13 is injected into the inside through the opening portions 12b, 12c, a number of which is three in this embodiment. The three opening portions 12b, 12c are arranged in a long-side direction of the rectangular ceramic substrate 3. The opening portions 12b positioned at both sides are injection ports for the silicone gel 13, and the central opening portion 12b is an air vent for venting air when the silicone gel 13 is injected.

The length of the air bent 12b in the short-side direction of the ceramic substrate 3 should be equal to or larger than that of each injection port 12b in the short-side direction thereof. Here, the short-side direction of the ceramic substrate 3 is approximately perpendicular to a moving direction in which the silicone gel 13 moves inside the enclosing member 12 when the silicone gel 13 is injected. In the present embodiment, the length of the air vent 12b in the short-side direction of the ceramic substrate 3 is approximately equal to that of each injection port 12b.

The length of the air vent 12c in the long-side direction of the ceramic substrate 3 is required to have a dimension that allows bubbles existing at the interface between the enclosing member 12 and the silicone gel 13 to be released. Preferably, the length of the air vent 12c in the long-side direction is 2 mm at least. Further, the area of the air vent 12c is preferably more than ¼ of the area of the injection port 12b to reduce bubbles efficiently.

Further, as shown in FIG. 4, partitioning portions 12a are provided between the air vent 12c and the respective injection ports 12b, and partition them in the short-side direction of the ceramic substrate 3. In an assembling step of the semiconductor device 100, for example, a suction nozzle as a transportation unit may transport the enclosing member 12 that is adhered thereto. In this case, the partitioning portions 12a can adhere to the suction nozzle.

Therefore, each partitioning portion 12a should have a width (length in the long-side direction of the ceramic substrate 3) sufficient for adhering to such a suction nozzle. In this embodiment, the width of the partitioning portion 12a in the long-side direction of the ceramic substrate is 4 mm. Because the enclosing member 12 is made of soft silicone rubber, the partitioning portions 12a keep the shape of the enclosing member 12.

Thus, the length of the air vent 12c in the short-side direction of the ceramic substrate 3 is set to be equal to or larger than that of each injection port 12b. Accordingly, bubbles can be released from the inside of the silicone gel 13 easily. As a result, bubbles remaining in the silicone gel 13 are reduced.

In addition, each partitioning portion 12a of the enclosing member 12 has the width that can be only adhered to the transportation unit, so that the area ratio of the partitioning portions 12a with respect to the upper surface of the enclosing member 12 is reduced as small as possible. That is, the upper surface of the partition member 12 is open at a degree that does not cause failures during the fabrication of the semiconductor device 100 and the total opening areas of the injection ports 12b and the air vent 12c are increased as large as possible. In consequence, bubbles in the silicone gel 13 can be reduced.

Incidentally, the enclosing member 12 in the present embodiment has a contour that is about 36 mm in length in the long-side direction of the ceramic substrate 3, and about 11 mm in length in the short-side direction thereof. Also, each injection port 12 is about 9.5 mm in length in the long-side direction, and about 9 mm in length in the short-side direction. The air vent 12c is about 7 mm in length in the long-side direction, and about 9 mm in length in the short-side direction.

Figure 6A:
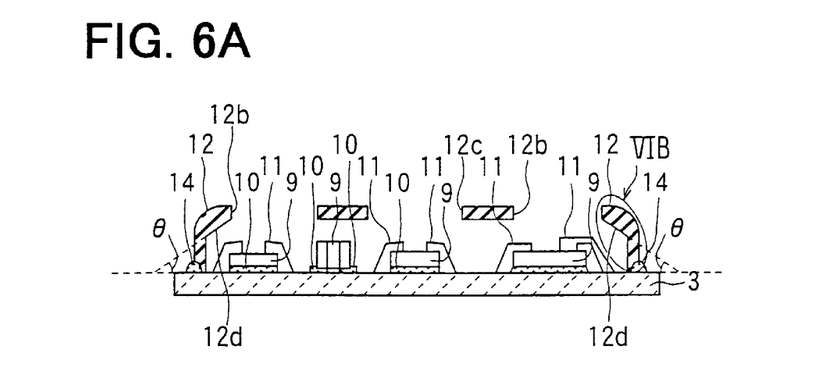
FIG. 6A is a cross-sectional view showing the ceramic substrate in a direction indicated by arrow VIA in FIG. 4.
Figure 6B:
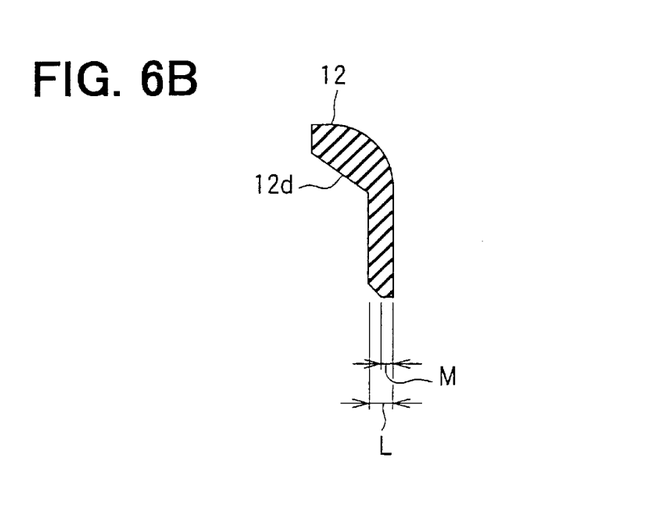
FIG. 6B is an enlarged view showing a part encircled with arrow VIB in FIG. 6A.

FIG. 6A is a cross-sectional view in a direction indicated by arrow VIA in FIG. 4, and FIG. 6B is an enlarged view showing a part encircled with arrow VIB in FIG. 6A. As shown in FIG. 6A, the enclosing member 12 has tapered portions 12d at an inner surface thereof at a boundary between the upper wall and sidewalls approximately perpendicular to the ceramic substrate 3. In the present embodiment, angle θ of each tapered portion 12d with respect to the ceramic substrate 3 is 45 degrees. The tapered portions 12d are thicker than the other portions of the enclosing member 12.

Thus, gas existing in the vicinity of the boundary between the upper wall of the enclosing member 12 and the sidewalls thereof can move along the tapered portions 12d toward the opposite side of the ceramic substrate 3, and can be released from the silicone gel 13. Because the tapered portions 12d are thick, the enclosing member 12 can be reinforced.

Further, considering the area for mounting the electronic parts 9, the movability of gas, and the formability of the enclosing member 12, it is found out that angle θ of each tapered portion 12d being 45 degrees is the most suitable. Furthermore, as shown in FIG. 6B, thickness L of each sidewall is set in a range of 0.3 to 0.5 mm to reduce the occupation area of the enclosing member 12 on the ceramic substrate 3. Here, a front end of the sidewall has thickness M in a range of 0.15 to 0.3 mm where it is joined to the ceramic substrate 3, thereby restricting the silicone system adhesive 14 from spreading.

The portion of the enclosing member 12 positioned approximately parallel to the ceramic substrate 3 is a portion of the enclosing member 12 provided at an opposite side of the electronic parts 9 with respect to the ceramic substrate 3, and needs not be always parallel to the ceramic substrate 3. The portion of the enclosing member 12 positioned approximately perpendicular to the ceramic substrate 3 is a portion other than the upper surface of the enclosing member 12, and needs not be always perpendicular to the ceramic substrate 3.

The inside of the enclosing member 12 is then filled with the silicone gel 13 for sealing the electronic parts 9 and the bonding wires 11. The silicone gel 13 is required to be low in height so as to reduce the amplitude of the silicone gel 13 when it oscillates. When the height of the silicone gel 13 is low, however, if bubbles exist at the interface between the silicone gel 13 and the enclosing member 12, the bubbles close to the bonding wires 11 can strain or break the bonding wires 11. To the contrary, in the present embodiment, because bubbles can be removed by adopting the above-structure, the height of the silicone gel 13 can be lowered to decrease the amplitude thereof.

The silicone gel 13 used in this embodiment should not be too soft and not be too hard. When the silicone gel 13 is too hard and is strained during thermal shock cycles of the semiconductor device 100, the silicone gel 13 cannot deform to move smoothly around the bonding wires 11. Therefore, the bonding wires 11 would be strained. In addition, stress would be applied to the electronic parts 9 to deteriorate connection reliabilities. On the other hand, if the silicone gel 13 is too soft and oscillation of the semiconductor device 100 is applied to the silicone gel 13, the amplitude of the silicone gel 13 becomes large, and this oscillation breaks the bonding wires 11.

In this connection, oscillation proof properties and cycle life at the thermal shock cycles of the bonding wires 11 were examined with variable hardness of the silicone gel 13. As a result, it is found out that a preferable penetration of the silicone gel 13, which represents hardness of the silicone gel 13 as an index, is in a range of 40 to 170 (mm/10) (Refer to JIS, K 2220), in case where the height of the silicone gel 13 from the surface of the ceramic substrate 3 in a normal direction of the ceramic substrate 3 is 5 mm, and the shape of the silicone gel 13 observed in the normal direction is a rectangle with a long side of 60 mm and a short side of 20 mm. Accordingly, the decrease in strength caused by the breakage and strain of the bonding wires 11 can be restricted effectively.

The amplitude of the silicone gel 13 decreases as the size of the silicon gel 13 decreases. Therefore, in the case where the height of the silicone gel 13 is 5 mm or less, and the shape of the silicone gel 13 observed in the normal direction is contained within a rectangle with a long-side of 60 mm and a short side of 20 mm, similarly, the breakage and strain of the bonding wires 11 can be restricted. Here, the shape contained in this rectangle means a shape that does not protrude from this rectangle, and includes a shape smaller than the rectangle to be contained therein, a shape having at least one side that is equal to the length of the rectangle and the like.

Next, the studies regarding the dimensions of the silicone gel 13 are explained below. First, a case of 80 mm×80 mm for holding the silicone gel 13 was prepared. Then, an electronic part was mounted on a ceramic substrate, and the electronic part and the ceramic substrate were electrically connected to each other through a bonding wire made of gold and having a diameter of 30 $\mu$m, thereby preparing a work. This work is placed in the case, and then, silicone gel having a penetration of 40 (mm/10) is injected into the case. Thus, a sample of silicone gel having a rectangular shape of 80 mm×80 mm in the normal direction of the ceramic substrate can be completed. In such sample, the height of the silicone gel in the normal direction of the ceramic substrate was varied, and a displacement amount of the silicone gel and a breakage life of the bonding wire were examined.

It was then confirmed that the breakage of the bonding wire did not occur when the displacement amount of the silicone gel was 50 $\mu$m or less. Here, the displacement amount of the silicone gel represents a distance between a center and an edge of oscillation when the silicon gel oscillates.

Figure 7:
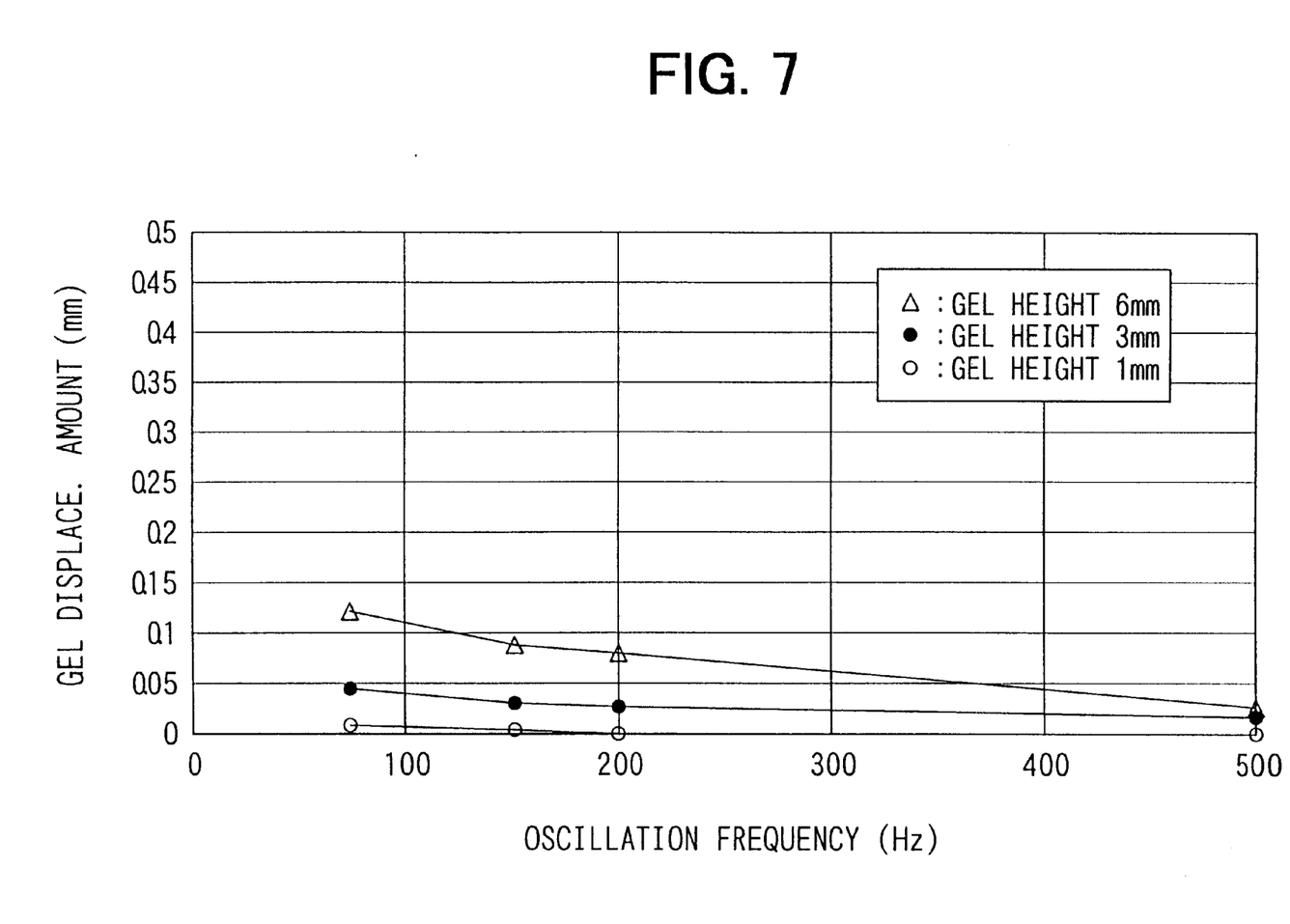
FIG. 7 is a graph showing a relation between oscillation frequency of silicone gel and the displacement amount of silicone gel.

In this connection, a relationship between the oscillation frequency and the displacement amount of the silicone gel 13 when the height of the silicon gel 13 was varied was examined using the displacement amount of 50 $\mu$m as an index value. The results are shown in FIG. 7, which were obtained when oscillating acceleration of 20G was applied to the above-described sample in which the height of the silicone gel was 6 mm, 3 mm, or 1 mm. The oscillation frequency is generally considered when the semiconductor device 100 is installed in a vehicle.

As understood from FIG. 7, it is revealed that the displacement of the silicone gel is 50 $\mu$m or less when the height of the silicone gel 13 is 3 mm or less. That is, the breakage of the bonding wires 11 can be prevented when the height of the silicone gel is 3 mm or less. Although these examinations were performed using the case whose size was 80 mm×80 mm, the above mentioned size is 60 mm×20 mm that is smaller than 80 mm×80 mm. Therefore, the displacement of the silicone gel 13 is also reduced. The case of 60 mm×20 mm was also examined likewise and also in this case, it is confirmed that the breakage of the bonding wires 11 can be prevented when the height of the silicone gel 13 is 5 mm.

Thus, the upper limit of the height of the silicone gel 13 is determined as above. The lower limit is determined so that all the bonding wires 11 of the electronic parts 9 are surrounded by the silicone gel 13. To obtain this state, although it depends on the heights of the electronic parts 9, the lower limit is, for example, 1.25 mm or more.

In the semiconductor device 100 shown in the figures, the height of the silicone gel 13 is 2.5 mm, and the shape thereof in a direction parallel to the ceramic substrate 3 is a rectangle with a long side of 39.5 mm and a short side of 14.5 mm. The penetration of the silicone gel 13 is 128±10 (mm/10). These dimensions and penetration of the silicone gel 13 fulfill the above-described conditions, and therefore can prevent the breakage and strain of the bonding wires 11 as described above.

Meanwhile, at the outside of the enclosing member 12 on the ceramic substrate 3, lands 22 are formed, and respective ends of the connection terminals 5 are disposed on and electrically connected to the lands 22 by solder 15. Thus, each of the ceramic substrates 3 is constructed as above, and bonded to the radiation fin 4 by silicone system adhesive 16.

As shown in FIG. 5, the ceramic substrates 3 and the electrical parts 9 mounted on the respective ceramic substrates 3 are covered with a cover 17 together. The cover 17 is a hard member made of, for example, PBT, and protects the electronic parts 9. The cover 17 is fixed, by silicone system adhesive 18, to an outer periphery of a surface of the radiation fin 4 to which the ceramic substrates 3 are mounted, so that the cover 17 covers not only the ceramic substrates 3 but also vicinities of the connecting portions of the connection terminals 5 and the ceramic substrates 3.

The ceramic substrates 3 thus mounted on the radiation fin 4 are, as shown in FIG. 3, mounted on the motherboard 1 approximately perpendicularly to the motherboard 1. In this state, the connection terminals 5 are fixed to the array board 6 and are electrically connected to the motherboard 1 by soldering. Specifically, the connection terminals 5 are fixedly positioned by being inserted into holes in the array board 6, and are mounted on the motherboard 1 accordingly.

The array board 6 is preferably composed of a member having a thermal expansion coefficient approximate to that of the motherboard 1. Accordingly, the array board 6 can maintain connection with the connection terminals 5 without producing cracks therein even when the respective members are deformed by the thermal shock cycles. In this embodiment, because a glass-epoxy substrate of about 15.5 ppm in thermal expansion coefficient is used as the motherboard 1, the array board 6 is preferably made of a material having a thermal expansion coefficient in a range of about 13 to 18 ppm.

Because the present embodiment adopts the several ceramic substrates 3 that require the several connection terminals 5, the long array board 6 is required to arrange the connection terminals 5 in a line. However, the deformation amount of the array board 6 caused by the thermal shock cycles is increased as the array board 6 is lengthened. Therefore, the array board 6 should have a thermal expansion coefficient approximate to that of the motherboard 1. Incidentally, if such a long array board is not necessitated, the array board 6 may be made of PBT. Thus, the semiconductor device 100 in the present embodiment is constructed.

In the present embodiment, because the dimensions and hardness of the silicone gel 13 are determined as described above, the bonding wires 11 can be prevented from being strained and broken in the semiconductor device 100 in which the electronic parts 9 and the bonding wires 11 are sealed with the silicone gel 13. Further, because the enclosing member 12 has the structure as described above, because bubbles can be removed easily from the silicone gel 13, and the dimensions of the silicone gel 13 can be set as described above.

Further, the electronic parts 9 and the bonding wires 11 are sealed with the silicone gel 13 for every ceramic substrate 3. Therefore, the silicone gel 13 needs not be injected into unnecessary portions. The volume of the silicone gel 13 can be reduced, as compared to the case where all the electronic parts disposed on the identical surface of the radiation fin 4 are sealed together. In general, the larger the volume of the silicone gel 13 becomes, the larger the amplitude of the silicone gel 13 becomes when oscillation is applied to the silicone gel 13. Because of this, in the present embodiment, the sealing with the silicone gel 13 is performed for every ceramic substrate 3 to reduce the volume of the silicone gel 13, and as a result, the amplitude of the silicone gel 13 can be suppressed and the breakage of the bonding wires 11 can be prevented effectively.

Supposing all the electronic parts 9 disposed on the radiation fin 4 are sealed together, bubbles are liable to be produced especially at step portions of the ceramic substrates 3 and the radiation fin 4. In the portion where the bubbles exist, the strain of the silicone gel 13 varies by the thermal shock cycles of the semiconductor device 100. Because of this, if bubbles exist in the vicinity of the respective bonding wires 11, the bonding wires 11 may be strained or broken. To the contrary, in the present embodiment, because the enclosing member 12 is disposed on every ceramic substrate 13, the silicone gel 13 can be injected excluding the step portions. As a result, the occurrence of bubbles can be suppressed at the minimum, and the strain and the breakage of the wires 11 can be prevented. In addition, the amount of the silicone gel 13 used for sealing can be reduced.

Also, supposing all the electronic parts 9 disposed on the radiation fin 4 are sealed together by the silicone gel 13, the enclosing member 12 must be disposed on the connection terminals 5 because the ceramic substrates 3 and the motherboard 1 are electrically connected to each other through the connection terminals 5. In this case, the shape of the enclosing member 12 may be complicated at the connecting portions with the connection terminals 5, and the silicone gel 13 may be leaked outside the enclosing member 12 at the connecting portions.

If the enclosing member 12 is disposed to avoid the connection terminals 5, there is a case where it must be disposed on the connecting portions between the ceramic substrates 3 and the radiation fin 4 because the several ceramic substrates 3 are used. In this case, the similar problem to the case where the enclosing member 12 is disposed on the connection terminals 5 occurs at the connecting portions between the ceramic substrates 3 and the radiation fin 4. To the contrary, according to the present embodiment, because the ceramic substrates 3 are sealed with the silicone gel 13 separately from each other, the above-described problems do not occur.

Next, the method for attaching the electronic parts 9 to the ceramic substrates 3 and attaching the ceramic substrates 3 to the radiation fin i4 is explained in an order of steps referring to FIGS. 8 through 11.

Figure 8A:
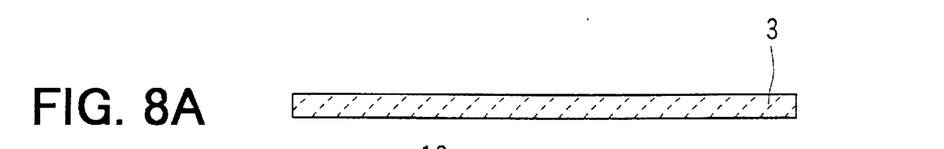
FIGS. 8A to 8E, 9A to 9D, 10A to 10D and 11 are cross-sectional views showing a method, in a stepwise manner, for attaching electronic parts to the ceramic substrate, and attaching the ceramic substrate to a radiation fin.
Figure 8B:
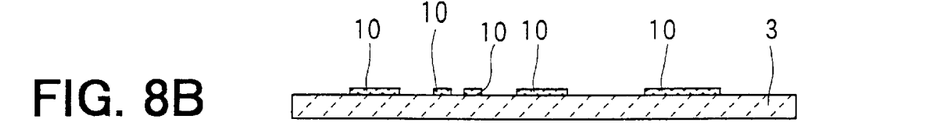

First, as shown in FIG. 8A, the ceramic substrates 3 are prepared, and a circuit (not shown) is formed on each ceramic substrate 3 by a thick-film screen-printing method and the lands for mounting the electronic parts and the lands for wire bonding are formed accordingly. Next, as shown in FIG. 8B, the conductive adhesive 10 is applied on the lands for mounting the electronic parts thereon by a screen-printing method.

Figure 8C:
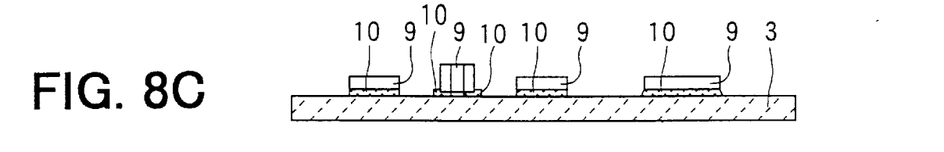

Referring to FIG. 8C, after the electronic parts 9 are mounted, the conductive adhesive 10 is set (hardened) at a temperature of, for example, 150° C. After that, the connection terminals 5 (not shown in FIGS. 8A to 8E) are disposed on the ceramic substrate 3, and solder paste is supplied to the connecting portions of the connection terminals 5 by using a dispenser. The solder paste contains solder powder dispersed in flux made of a polymerized rosin system material.

Then, the solder paste is hardened and the connecting terminals 5 are soldered to the ceramic substrate 5 in an IR reflow furnace at, for example, 230° C.

Figure 8D:
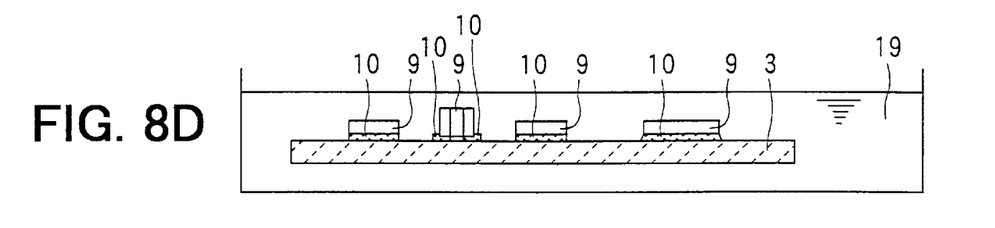
Figure 8E:
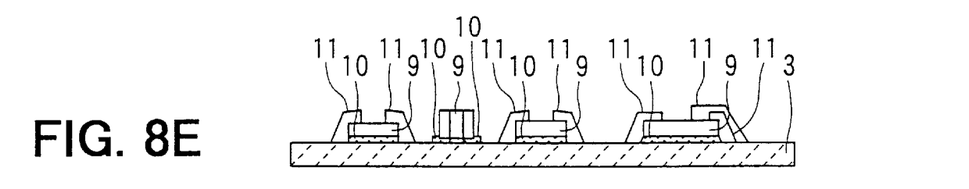

At that time, flux is adhered to the surface of the ceramic substrate 3 including the lands for wire bonding. Therefore, as shown in FIG. 8D, the entirety of the ceramic substrate 3 is immersed into washing solution 19 to remove the flux attached to the ceramic substrate 3. Specifically, first, the ceramic substrate 3 is immersed into glycol ether (washing solution) as a first solvent. In this case, for example, the temperature of glycol ether is set at 65° C., and the ceramic substrate 3 is immersed therein for 20 minutes. Accordingly, the flux on the ceramic substrate 3 can be removed.

Next, the ceramic substrate 3 is immersed into pure water as a second solvent to remove glycol ether attached to the surface of the ceramic substrate 3. In this case, for example, the temperature of pure water is controlled to be 25° C., and the ceramic substrate 3 is immersed therein for 20 minutes. Then, the ceramic substrate 3 is taken out of pure water, and is dried at, for example 130° C., for 60 minutes. Thus, the washing of the ceramic substrate 3 is finished.

In the washing of the ceramic substrate 3, as the washing progresses, a concentration of flux dissolved in glycol ether and a concentration of glycol ether dissolved in pure water increase. Then, the amounts of flux and glycol ether remaining on the ceramic substrate 3 after washing increase as the concentrations increase. Flux and glycol ether remaining on the ceramic substrate 3 works as residues and deteriorate the connection properties of the bonding wires 11. Therefore, it is necessary to control the flux concentration in glycol ether and the glycol ether concentration in pure water. These concentrations were studied and examined as follows.

First, several ceramic substrates, each having an Ag thick film on a surface thereof, were prepared as test samples. Further, first and second solutions were prepared. The first solution contains rosin system flux diluted with freon system solvent, and the second solution contains glycol ether diluted with pure water. Specifically, the first solution was prepared with various flux concentrations and the second solution was prepared with various glycol ether concentrations.

Then, the respective ceramic substrates were immersed into the respective solutions, and taken out of them, and dried sufficiently. Then, wire bonding was performed onto the Ag thick film using an Au wire. After that, the respective ceramic substrates were examined to obtain shear strengths thereof when the Au wire was separated (detached) from the Ag thick film.

Figure 12A:
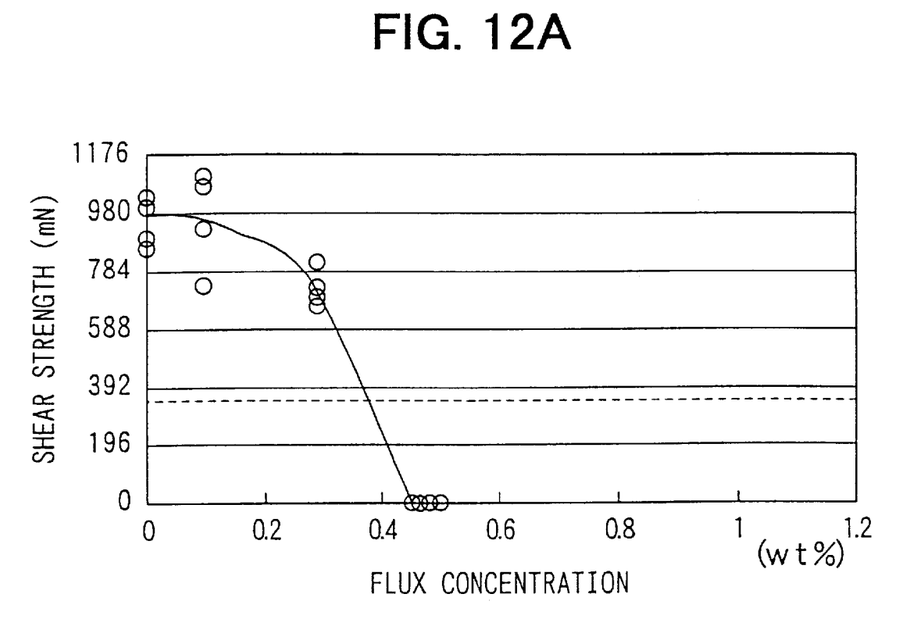
FIG. 12A is a graph showing a relation between a flux concentration and shear strength of a bonding wire.
Figure 12B:
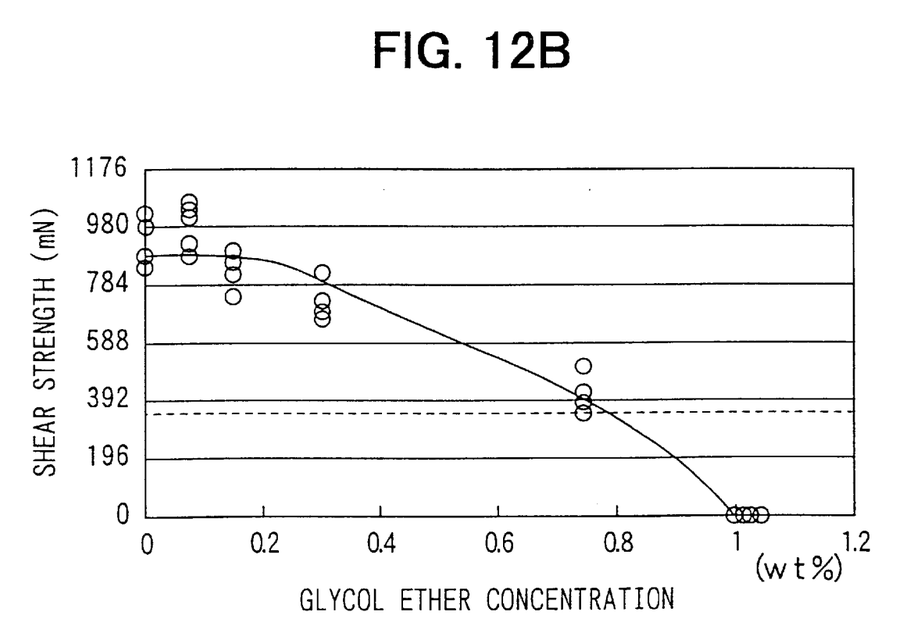
FIG. 12B is a graph showing a relation between a glycol ether concentration and shear strength of a bonding wire.

The results are shown in FIGS. 12A and 12B. FIG. 12A shows a relation between the flux concentration in the first solution and the shear strength, while FIG. 12B shows a relation between the glycol ether concentration in the second solution (washing solution concentration) and the shear strength. As shown in FIGS. 12A and 12B, as the flux concentration or the glycol ether concentration increases, the shear strength decreases to lessen the connecting property of the bonding wire.

In general, when an electronic part is connected through an Au wire, the shear strength equal to or larger than 343 mN (35 gf) is required. That is, according to FIGS. 12A and 12B, the flux concentration in the first solution is required to be 0.4 wt % or less, and the glycol ether concentration in the second solution is required to be 0.8 wt % or less. Also, considering case where the shear strength is 784 mN (80 gf) in order to provide the connecting property of the bonding wire more securely, the flux concentration should be 0.3 wt % or less and the glycol ether concentration should be 0.3 wt % or less.

Therefore, in the present embodiment, when the ceramic substrate 3 is washed, glycol ether is controlled so that the flux concentration in glycol ether is kept at 0.4 wt % or less, and more preferably 0.3 wt % or less. Further, the glycol ether concentration in pure water is controlled to be 0.8 wt % or less and more preferably 0.3 wt % or less. A refractometer may be used to control these concentrations. Incidentally, in practice, flux exists in glycol ether because the flux is washed in glycol ether. However, because glycol ether itself affects the connecting property of the bonding wire, in the above examinations, flux was diluted with freon system solvent in order to study the effect of only the flux.

Thus, according to the present embodiment, after the ceramic substrate 3 is washed, washing residues such as flux and glycol ether that adversely affect the bonding performance can be significantly reduced. As a result, the connecting properties of the bonding wires can be improved significantly.

Then, after the ceramic substrate 3 is washed as described above, as shown in FIG. 8E, the lands on the electronic parts 9 and the lands for the wire bonding on the ceramic substrate 3 are connected to each other by the bonding wires 11.

Figure 9A:
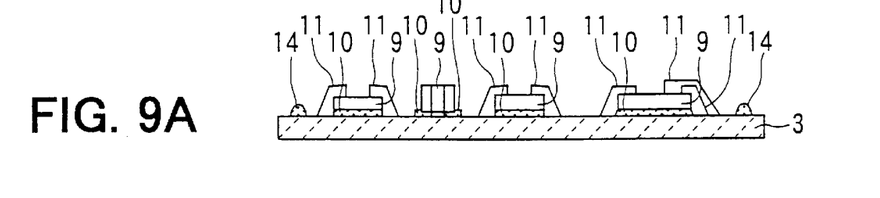
Figure 9B:
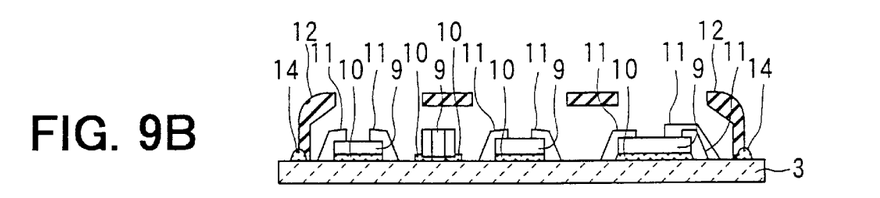
Figure 9C:
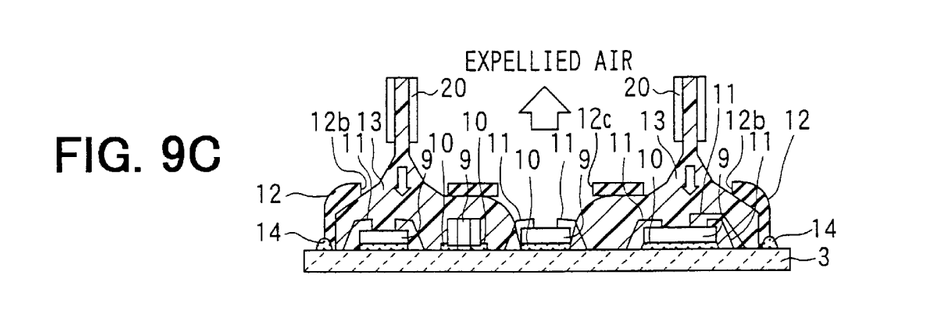
Figure 9D:
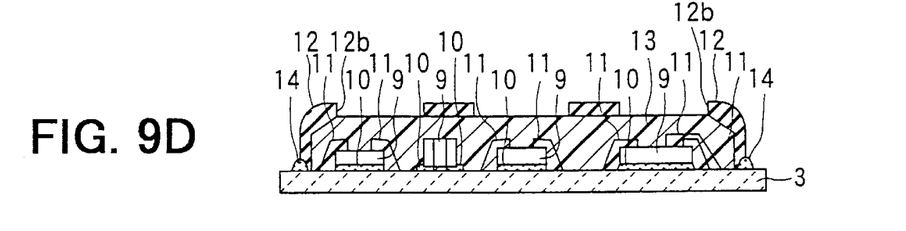

Next, as shown in FIG. 9A, the silicone system adhesive 14 is applied to the ceramic substrate 3 by using a dispenser. Then, as shown in FIG. 9B, the enclosing member 12 is placed on the adhesive 14, and the adhesive 14 is set at, for example 150° C. Accordingly, the enclosing member 12 is fixed to the ceramic substrate 3. Successively, as shown in FIG. 9C, the silicone gel 13 is injected by using a dispenser 20 into the enclosing member 12 through the injection ports 12b that are formed at both sides of the upper surface of the enclosing member 12. As a result, the state shown in FIG. 9D can be provided.

Figure 10A:
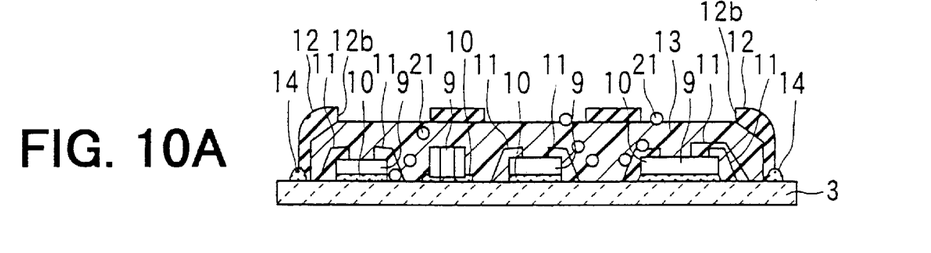
Figure 13:
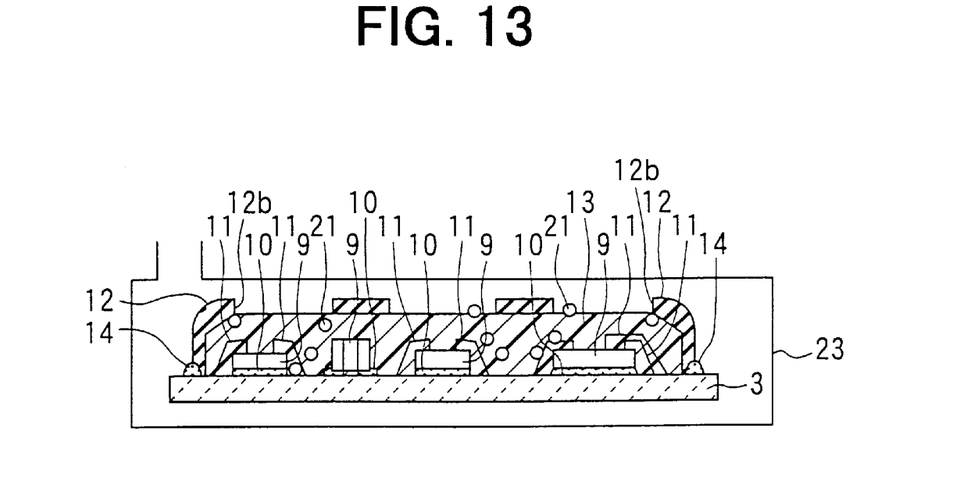
FIG. 13 is a cross-sectional view showing an example of the step shown in FIG. 10A.

After that, gas inside the enclosing member 12 is expelled externally from the air vent 12c due to the silicone gel 13 that is injected into the enclosing member 12. Further, although it is not shown, in the sate shown in FIG. 9D, bubbles exist in the silicone gel 13 around the electronic parts 9 and the like. Therefore, as shown in FIG. 10A, the entirety of the ceramic substrate 3 is placed under reduced pressure environment so that bubbles 21 are removed from the silicone gel 13. For example, as shown in FIG. 13, the ceramic substrate 3 may be put in a degas chamber 23 having a reduced pressure to remove bubbles 21 from the silicone gel 13.

Figure 10B:
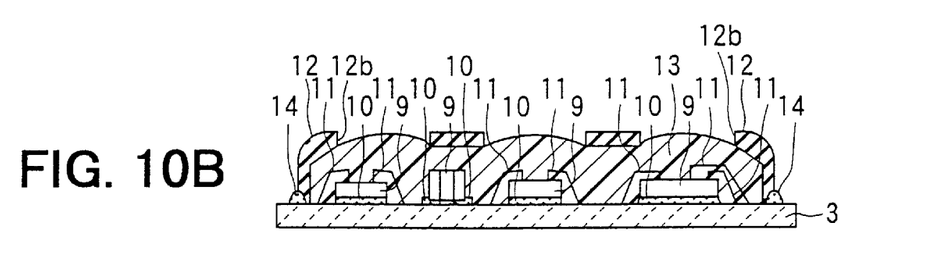
Figure 10C:
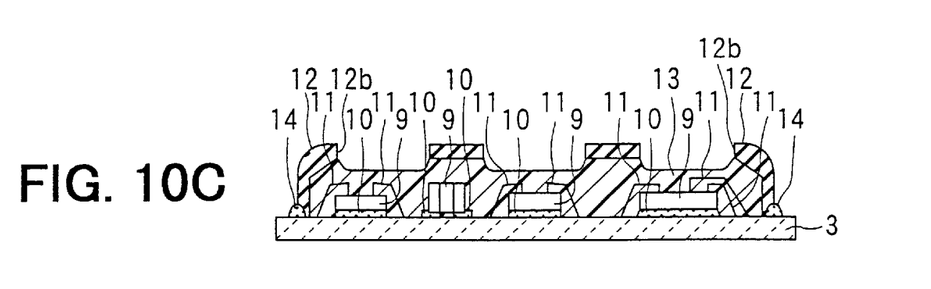
Figure 10D:
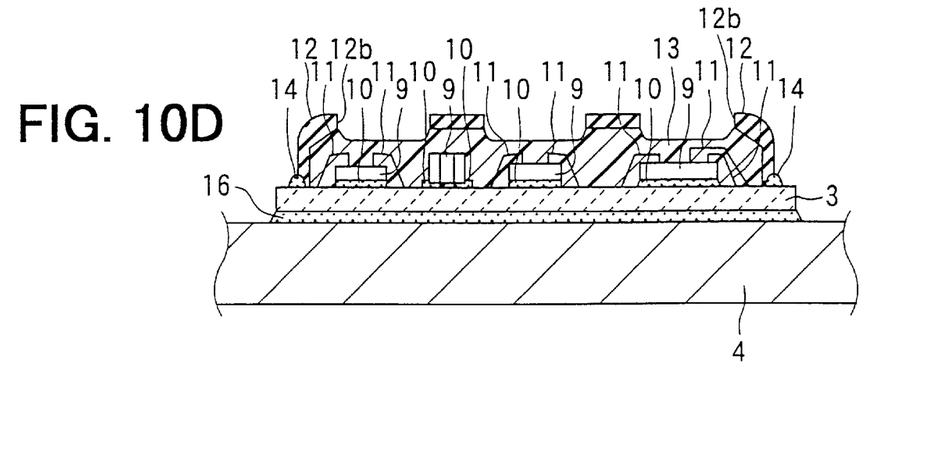
Figure 11:
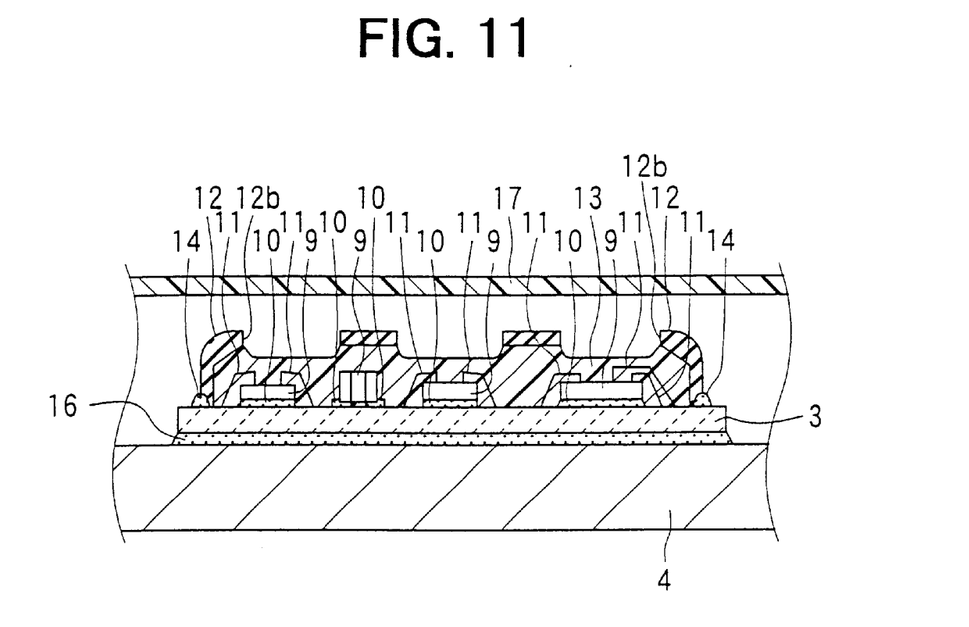

After that, the ceramic substrate 3 is heated at, for example, 145° C. to set the silicone gel 13, so that the state shown in FIG. 10B at the high temperature is provided. Then, the silicone gel 13 shrinks at the room temperature, thereby providing the state shown in FIG. 10C. Next, as shown in FIG. 10D, the ceramic substrate 3 is bonded to the radiation fin 4 by the silicone system adhesive 16. Finally, as shown in FIG. 11, the cover 17 is attached to cover the several ceramic substrates 3. Thus, the mounting of the ceramic substrates 3 to the radiation fin 4 is completed. Incidentally, FIGS. 9 to 11 show the steps focusing on one of the ceramic substrates 3.

In the present embodiment, the ceramic substrate 3 is washed before wire bonding and before sealing with the silicone gel 13. Therefore, the washing of the ceramic substrate 3 does not damage the silicone gel 13. The washing residues do not adhere to the bonding wires. Further, because washing residues are reduced by appropriately controlling the flux concentration and the glycol ether concentration in the washing as described above, the connecting properties of the bonding wires can be improved.

Although the bonding wires 11 are made of Au, they may be made of Al. The bonding wires 11 may be made of materials other than Au and Al, with a diameter smaller than 150 μm in the present embodiment. Even when the diameter of the bonding wire is smaller than 150 μm to have a small bonding area, the bonding property is sufficient according to the present invention.

When the bonding wires are made of Au, lands for the bonding wires are usually formed from an Ag thick film considering the bonding property based on the metal kinds. The Ag thick film, however, has surface irregularity because of its thick thickness, so that washing residues are liable to remain thereon. However, according to the present embodiment, the washing residues can be effectively reduced even in the case of the bonding wires made of Au.

On the other hand, when the bonding wires are made of Al, lands for the wires are usually plated with Ni on the surface thereof. The Ni-plated lands have smooth surfaces so that washing residues are difficult to remain on the lands as compared to the case of the lands formed from the Ag thick film. In addition, even if a certain amount of washing residues remains on the lands, the washing residues can be easily removed when performing the bonding under a specific condition in the case of Al that is harder than Au.

Meanwhile, recently, the electronic parts 9 have been bonded to the ceramic substrate 3 by conductive adhesive to exclude Pb. The conductive adhesive has a setting temperature of about 150° C. Therefore, in this case, the wire bonding should be performed at a low temperature to maintain the bonding properties of the electronic parts 9. The low-temperature wire bonding is also desirable to protect the electronic parts 9.

Here, when the wire bonding is performed at a high temperature, washing residues can be removed further. However, the low-temperature wire bonding is difficult to remove the washing residues in comparison with high-temperature wire bonding. Even in this case, the washing residues can be reduced by controlling the flux concentration in glycol ether and the glycol ether concentration in pure water when the ceramic substrate 3 is washed according to the present embodiment, and the connecting properties of the bonding wires can be improved.

While the present invention has been shown and described with reference to the foregoing preferred embodiment, it will be apparent to those skilled in the art that changes in form and detail may be made therein without departing from the scope of the invention as defined in the appended claims.

For example, molded ICs may be mounted on the ceramic substrate 3 through leads. The solder connecting members are not limited to the connecting terminals 5 as in the present embodiment, but may be other members.

What is claimed is:

1. A semiconductor device comprising:
   a support member;
   a plurality of substrates mounted on the support member;
   an electronic part mounted on one of the plurality of substrates;
   a bonding wire electrically connecting the electronic part and the one of the plurality of substrate;
   an enclosing member covering the electronic part and the bonding wire, wherein:
   the plurality of substrates are mounted on a main surface of the support member,
   the enclosing member is composed of a plurality of enclosing members each of which is attached to a corresponding one of the plurality of substrates; and a sealing material filling the enclosing member for sealing the electronic part and the bonding wire in the enclosing member.

2. The semiconductor device according to claim 1, wherein a diameter of the bonding wire is smaller than 150 μm.

3. The semiconductor device according to claim 1, further comprising:
a plurality of connecting terminals electrically connecting to the plurality of substrates; and
an array plate provided for positioning the plurality of connecting terminals.

4. The semiconductor device according to claim 3, wherein the array plate has a thermal expansion coefficient in a range of 13 to 18 ppm.

5. The semiconductor device according to claim 1, wherein the sealing material has a penetration in a range of 40 to 170 mm/10.

6. The semiconductor device according to claim 1, wherein the support member is a radiation member.

7. The semiconductor device according to claim 1, wherein the enclosing member is made of silicone rubber.

8. The semiconductor device according to claim 1, wherein the bonding wire is made of one of Au and Al.

9. A semiconductor device comprising:
a support member;
a plurality of silicone rubber substrates attached to a surface of the support member, each of the plurality of substrate holding an electronic part thereon and electrically connected to the electronic part through a bonding wire;
a plurality of enclosing members each of which is attached to a corresponding one of the plurality of substrates and covers the electronic part and the bonding wire; and
a sealing material filling an inside of each enclosing member for sealing the electronic part and the bonding wire covered by the each enclosing member.

10. The semiconductor device according to claim 9, further comprising:
a motherboard on which the plurality of substrates are mounted together with the support member; and
a plurality of connecting terminals electrically connecting the plurality of substrates and the motherboard, the plurality of connecting terminals being connected to the plurality of substrates at an outside of each enclosing member.

11. The semiconductor device according to claim 10, further comprising an array plate disposed on the motherboard for positioning the plurality of connecting terminals, wherein:
each of the motherboard and the array plate has a thermal expansion coefficient in a range of 13 to 18 ppm.

12. The semiconductor device according to claim 9, further comprising a cover member covering all of the plurality of enclosing members attached to the plurality of substrates.

13. A semiconductor device comprising:
an electronic part mounted on a substrate;
a bonding wire electrically connecting the electronic part and the substrate;
a silicone rubber enclosing member covering the electronic part and the bonding wire; and
a sealing material filling the enclosing member for sealing the electronic part and the bonding wire in the enclosing member, wherein:
the enclosing member has a first opening portion for injecting the sealing material into the enclosing member and a second opening portion for releasing gas from the enclosing member when the sealing material is injected.

14. The semiconductor device according to claim 13, wherein the second opening portion has a width equal to or larger than that of the first opening portion.

15. The semiconductor device according to claim 13, wherein a diameter of the bonding wire is smaller than 150 μm.

16. The semiconductor device according to claim 13, wherein the first opening portion and the second opening portion are open on an upper surface of the enclosing member, approximately in parallel with the substrate.

17. The semiconductor device according to claim 13, wherein the enclosing member has a flat portion on an upper surface thereof, the flat portion being for adhering to a transportation member when the enclosing member is transported.

18. The semiconductor device according to claim 13, wherein the enclosing member has a tapered portion on an inner surface thereof.

19. The semiconductor device according to claim 13, wherein:
the first opening portion and the second opening portion are formed in an upper wall of the enclosing member, the upper wall extending above the substrate approximately in parallel with the substrate; and
the upper wall has a partitioning portion partitioning the first opening portion and the second opening portion.

20. The semiconductor device according to claim 13, wherein:
the enclosing member has an upper wall extending above the substrate approximately in parallel with the substrate, a sidewall approximately perpendicular to the substrate, wherein:
the upper wall has the first opening portion and the second opening portion; and
a tapered portion is provided at an inner surface of the enclosing member between the sidewall and the upper wall.

21. A semiconductor device comprising:
a substrate;
an electronic part disposed on the substrate;
a bonding wire electrically connecting the electronic part and the substrate;
a sealing member covering and sealing the electronic part and the bonding wire, wherein:
the sealing member has a height equal to or smaller than 5 mm in a normal direction of the substrate, a shape that is contained in a rectangle having a long side of 60 mm and a short side of 20 mm, and a penetration in a range of 40 to 170 mm/10; and
an enclosing member covering the electronic part and the bonding wire on the substrate and made of silicone rubber,
wherein the sealing member fills a space surrounded by the enclosing member.

22. The semiconductor device according to claim 21, wherein the bonding wire has a diameter smaller than 150 μm.

23. The semiconductor device according to claim 21, wherein the height of the sealing member is equal to or smaller than 3 mm.

24. The semiconductor device according to claim 21, wherein:
- the height of the sealing member is equal to or smaller than 2.5 mm;
- the shape of the sealing member is a rectangle having a long side of 39.5 mm and a short side of 14.5 mm; and
- the penetration is 128±10 mm/10.

25. A semiconductor device comprising:
- a support member;
- a plurality of substrates mounted on the support member;
- an electronic part mounted on one of the plurality of substrates;
- a bonding wire electrically connecting the electronic part and the one of the plurality of substrate;
- a silicone rubber enclosing member covering the electronic part and the bonding wire; and
- a sealing material filling the enclosing member for sealing the electronic part and the bonding wire in the enclosing member.

26. The semiconductor device according to claim 25, wherein a diameter of the bonding wire is smaller than 150 $\mu$m.

27. The semiconductor device according to claim 25, further comprising:
- a plurality of connecting terminals electrically connecting to the plurality of substrates; and
- an array plate provided for positioning the plurality of connecting terminals.

28. The semiconductor device according to claim 27, wherein the array plate has a thermal expansion coefficient in a range of 13 to 18 ppm.

29. The semiconductor device according to claim 25, wherein the sealing material has a penetration in a range of 40 to 170 mm/10.

30. The semiconductor device according to claim 25, wherein the support member is a radiation member.

31. The semiconductor device according to claim 25, wherein the bonding wire is made of one of Au and Al.

* * * * *